(12) United States Patent
Yelamos Ruiz

(10) Patent No.: US 8,791,850 B2
(45) Date of Patent: Jul. 29, 2014

(54) ANALOG-TO-DIGITAL CONVERSION WITH MULTIPLE KERNELS

(71) Applicant: Infineon Technologies AG, Neubiberg (DE)

(72) Inventor: Pablo Yelamos Ruiz, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/650,515

(22) Filed: Oct. 12, 2012

(65) Prior Publication Data

US 2014/0104089 A1 Apr. 17, 2014

(51) Int. Cl.
*H03M 1/66* (2006.01)

(52) U.S. Cl.
USPC .......................................... 341/155; 341/141

(58) Field of Classification Search
USPC ................. 341/155, 141, 122; 702/72, 66, 69
See application file for complete search history.

(56) References Cited

U.S. PATENT DOCUMENTS

| 6,788,235 | B1   | 9/2004  | Barrenscheen et al.       |
|-----------|------|---------|---------------------------|
| 6,856,924 | B2 * | 2/2005  | MacDonald ........... 702/72 |
| 7,283,074 | B2 * | 10/2007 | Sheng et al. ........ 341/120 |
| 7,292,170 | B2 * | 11/2007 | Kinyua et al. ....... 341/141 |
| 7,382,304 | B2 * | 6/2008  | Stein ................ 341/155 |
| 7,945,428 | B2 * | 5/2011  | Fox et al. ........... 702/189 |
| 7,948,423 | B2 * | 5/2011  | Taft et al. ........... 341/155 |
| 8,169,354 | B2 * | 5/2012  | Douzane et al. ...... 341/155 |

FOREIGN PATENT DOCUMENTS

DE 102007054852 A1 6/2008

* cited by examiner

*Primary Examiner* — Peguy Jean Pierre
(74) *Attorney, Agent, or Firm* — Eschweiler & Associates, LLC

(57) ABSTRACT

An analog-to-digital conversion system includes at least two analog-to-digital conversion units configured to receive a plurality of analog signals and convert the analog signals to digital signals. The system further includes a delay unit including at least one delay circuit, wherein the analog-to-digital conversion system is configured to convey trigger signals to the analog-to-digital conversion units, and wherein at least one of the trigger signals is delayed via the at least one delay circuit.

17 Claims, 6 Drawing Sheets

ANALOG-TO-DIGITAL CONVERSION WITH MULTIPLE KERNELS

FIELD

Embodiments of the present invention relate to a device that may be used in the domain of analog-to-digital conversion.

BACKGROUND

Analog-to-digital converters (ADCs) convert analog signals to digital signals. Innumerable embodiments have been known for many years and require no further explanation. Several types of measurements, e.g., "burst conversion" (i.e., several measurements in a short period of time, e.g., 100 ns, logarithmic distribution of measurements, etc.) are not supported by present ADCs without supplying several timer units that need to be specially synchronized. Power conversion topologies like solar inverters, switched-mode power supplies (SMPS) or DC-DC-converters use operating frequencies in a high megahertz range (amounting to, e.g., 30 MHz), which leads to a need for faster conversion sequences.

SUMMARY

A first embodiment relates to an analog-to-digital conversion system comprising at least two analog-to-digital conversion units for receiving a plurality of analog signals and converting the analog signals to digital signals. The system also comprises a delay unit comprising at least one delay circuit, wherein the analog-to-digital conversion system is configured to convey trigger signals to the analog-to-digital conversion units, wherein at least one of the trigger signals is delayed via the at least one delay circuit.

The analog-to-digital conversion unit may be implemented as and/or referred to as a kernel.

A second embodiment relates to an analog-to-digital converter comprising at least two analog-to-digital conversion units for receiving a plurality of analog signals and converting the analog signals to digital signals. The converter also comprises a delay unit comprising at least one delay circuit. The delay unit is configured to asynchronously trigger the analog-to-digital conversion units via the at least one delay circuit.

A third embodiment relates to an analog-to-digital conversion system comprising several analog-to-digital conversion units for receiving a plurality of analog signals and converting the analog signals to digital signals. The system also comprises a delay unit comprising several delay circuits. The analog-to-digital conversion system is configured to successively convey trigger signals to each of the analog-to-digital conversion units, wherein a delay between conveying the trigger signals is adjustable via the delay circuits of the delay unit.

A forth embodiment is directed to a microcontroller comprising at least one analog-to-digital converter as described herein.

A fifth embodiment relates to a method for converting analog signals into digital signals comprising converting a plurality of analog signals into digital signals based on trigger signals that are successively provided to several analog-to-digital conversion units, wherein the trigger signals are supplied by a delay unit via delay circuits.

A sixth embodiment is directed to an analog-to-digital conversion system comprising means for converting a plurality of analog signals into digital signals based on trigger signals that are successively provided to several analog-to-digital conversion units, and means for supplying the trigger signals.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

The ADC described in greater detail can be part of a microcontroller. However, it is noted that there is no limitation to use the disclosed ADC converter: The microcontroller may comprise an arbitrary plurality of ADC converters of the type described herein, and ADC converters of the type described herein can also be utilized outside microcontrollers (i.e., in other devices or as separate ADC converter modules comprising one or more ADC converters).

An embodiment presented allows for sampling of different signals in different analog-to-digital conversion units, which are herein referred to as "kernels" of an analog-to-digital converter (ADC). For example, four different signals can be sampled in four or fewer different kernels.

A delay unit can be provided externally to the kernels, in particular within or separate to the ADC. The delay unit comprises delay elements that are added, e.g., within a synchronization or trigger path to the respective kernels. Hence, it is possible to provide a fast series of several (e.g., four in case of the four signals mentioned above) consecutive conversions within a time frame (also referred to as a time window). Advantageously, this conversion can be configurable in a flexible manner and it provides a very fast conversion capability. Due to its configurability, the distribution of measurements can be adjusted within the time frame, e.g., on a logarithmic or an exponential time scale.

This approach allows for new possibilities and applications utilizing various types of measurements in a fast and/or configurable way.

It is noted that using four different kernels and/or four signals is only one embodiment to illustrate the approach presented herein. The delay unit may comprise several stages that allow for a different number of delays and thus triggers and/or measurements in particular within the time frame. Basically, by supplying the delay unit (advantageously separate to at least two kernels), small and configurable amounts of delay between different trigger signals can be provided. The (at least partially) delayed trigger signals are, e.g., fed to the kernels of the ADC analog-digital-converter. By adjusting the delay of these triggers, the time for each kernel when to conduct a measurement can be flexibly adjusted, e.g., preconfigured. Such configuration can be a feature of the ADC and/or the microcontroller comprising at least one ADC.

Figure 1:
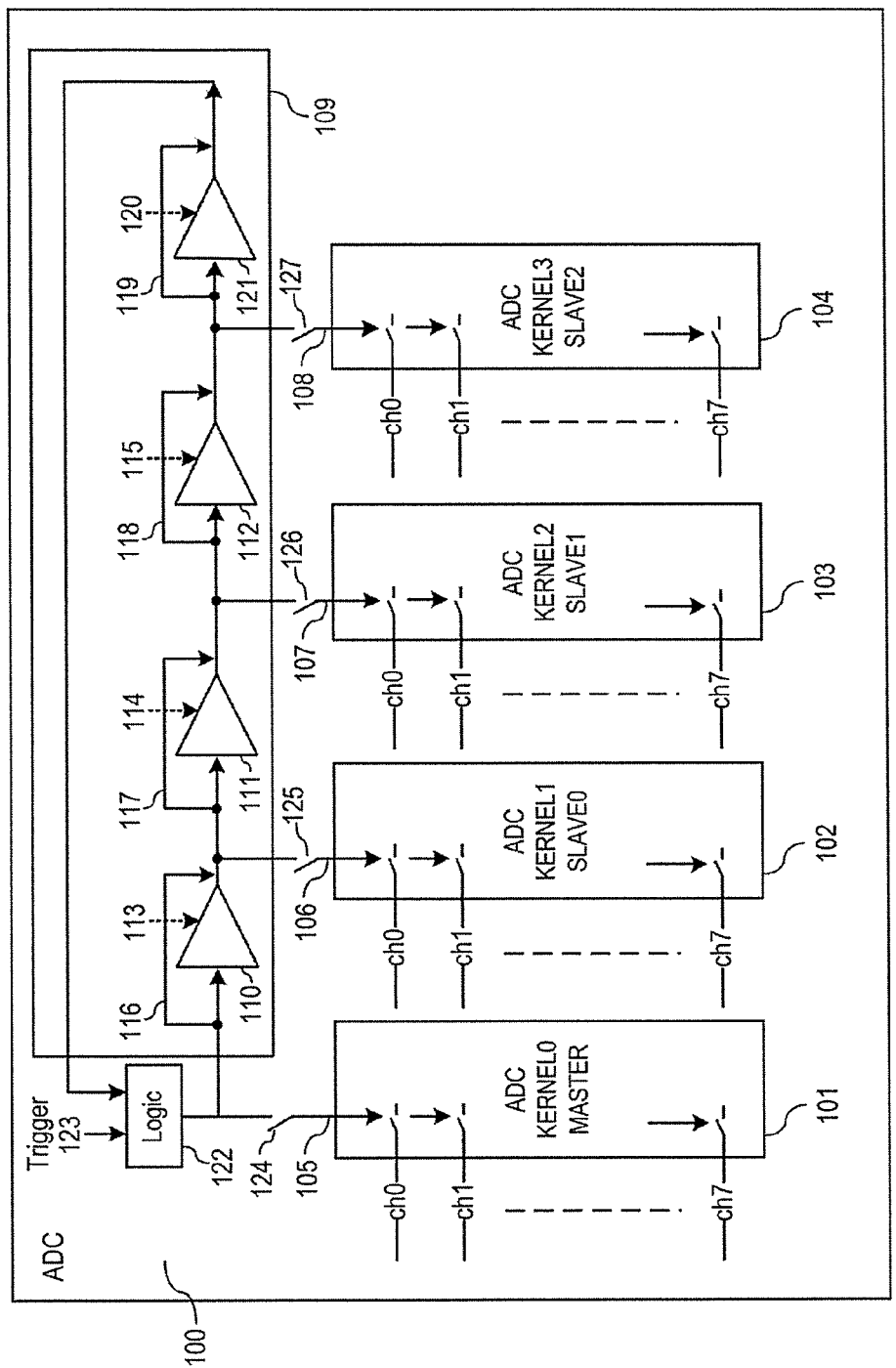
FIG. 1 shows a schematic diagram comprising several kernels of an ADC and a separate delay unit supplying trigger signals to at least a portion of the kernels.

FIG. 1 shows a schematic diagram comprising several kernels 101 to 104 of an ADC 100. In this embodiment, the kernel 101 is an ADC master kernel and the kernels 102 to 104 are ADC slave kernels. Each kernel 101 to 104 has, for example, eight analog input channels (referenced as "ch0" to "ch7") and a trigger input 105 to 108. Via the trigger input 105 to 108, a conversion of a measurement is initialized for the kernels 101 to 104, i.e. based on a trigger signal applied to the trigger input 105 to 108. The respective kernel 101 to 104 then conducts an analog-to-digital conversion and provides the result of such conversion via, e.g., an output register (not shown in FIG. 1).

The ADC 100 further comprises a delay unit 109, which is located separate to the kernels 101 to 104. The delay unit 109 comprises several delay circuits 110, 111, 112 and 121, which can be adjusted via a delay control 113, 114, 115 and 120 (applied, e.g., via a delay control unit, not shown in FIG. 1). In addition, the delay circuits 110, 111, 112 and 121 could each be skipped (indicated by a connection 116 to 119, which could be controlled by the delay unit 109).

It is noted that the delay unit 109 may be allocated outside of the ADC as well.

An output of the delay circuit 121 and a trigger signal 123 are fed to a logic unit 122, which allows combining and/or masking the two input signals and supplies a trigger signal 105 to the kernel 101 and to the delay circuit 110. The output of the delay circuit 110 provides a trigger signal 106 to the kernel 102 and to the delay circuit 111. The output of the delay circuit 111 feeds a trigger signal 107 to the kernel 103 and to the delay circuit 112. The output of the delay circuit 112 is fed to the kernel 104 and to the delay circuit 121.

The last trigger 108 can be fed back via the delay circuit 121 (or directly) towards the kernel 101 for daisy chaining and for a repetition of the sequence.

As an option, electronic switches 124 to 127 can be provided connecting the triggers signals 105 to 108 and the kernels 101 to 104. Hence, the trigger signals 105 to 108 can be disabled for at least one of the kernels 101 to 104, which is to be excluded from the conversion sequence. The switches 124 to 127 can be located within or external to the delay unit 109.

Hence, the delay unit 109, which in one embodiment is located outside of any kernel 101 to 104, provides delayed trigger signals 105 to 108 in a configurable manner, e.g., advantageously as multiples of clock cycles.

The master kernel does not have to be a fixed kernel, i.e. all kernels are able to receive delayed triggers. Hence, each of the kernels can act as master or slave kernel. Therefore, the order of the kernels can be flexibly selected.

In addition, each delay provided by the delay circuits 110, 111, 112 and 121 can be flexibly configured. For example, the amount of delay introduced by the delay circuits 110, 111, 112 and 121 may each be the same or may be partially different.

It may be advantageous to determine the amount of delay in multiples of a clock cycle (e.g., multiples of 8.33 ns). The actual delays selected may in one embodiment be based on a sensor and on pin impedances as well as a current source loading the pin and/or sensor after the sampling process has been conducted. The individual setup of the amounts of delay may depend on a particular use case and can be set individually for each type of implementation.

Figure 2:
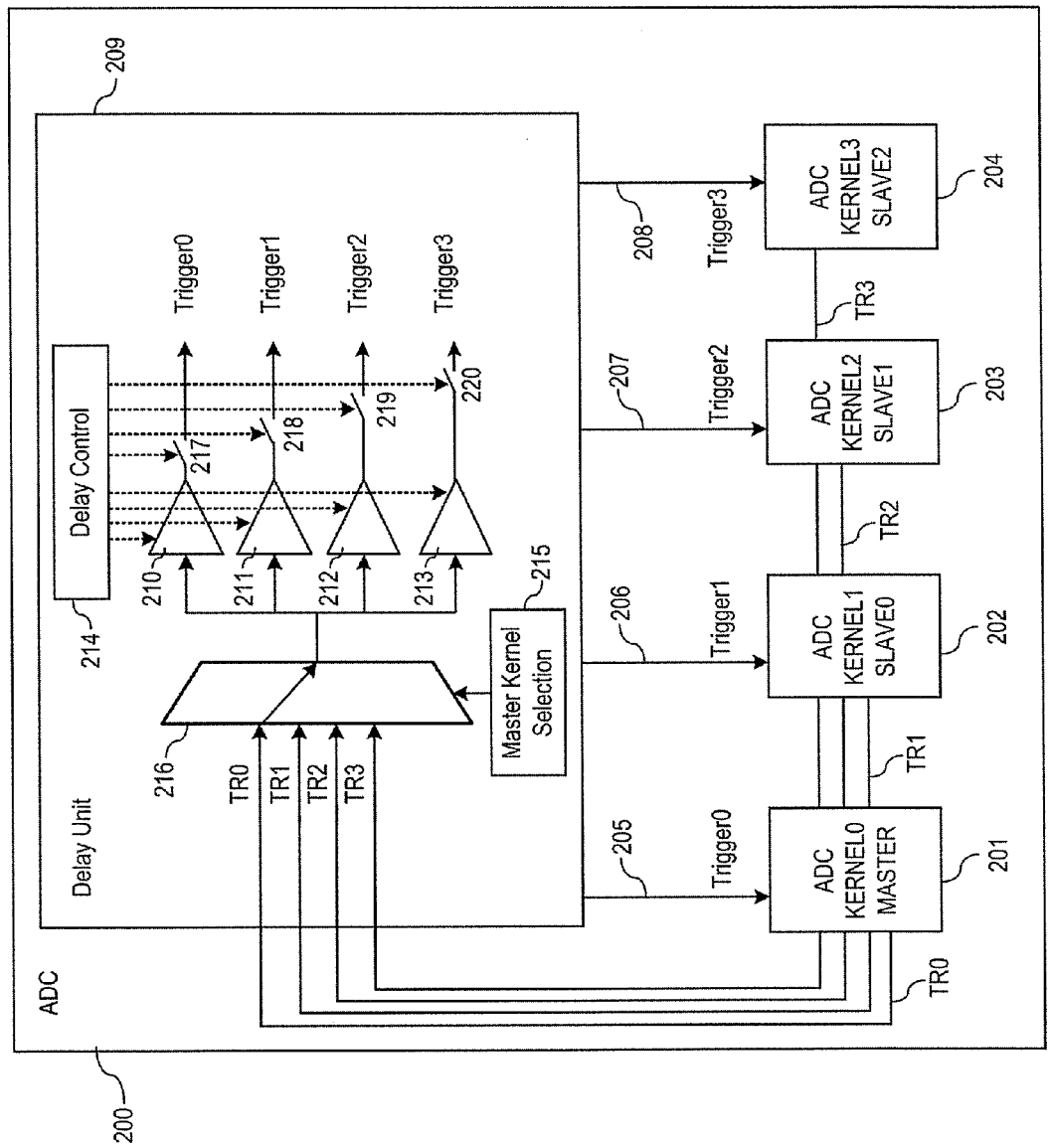
FIG. 2 shows a schematic diagram of an example implementation of a delay unit supplying trigger signals to several kernels.

FIG. 2 shows a schematic diagram of an example implementation of a delay unit 209 supplying trigger signals 205 to 208 to several kernels 201 to 204. An ADC 200 may comprise the kernels 201 to 204 and the delay unit 209.

The delay unit 209 comprises a selection unit 216 with a master kernel selection unit 215, several delay circuits 210 to 213 and a delay control unit 214. The output of the delay circuits 210 to 213 is conveyed as trigger signals 205 to 208 (also referred to as "Trigger0" to "Trigger3") to the kernels 201 to 204, respectively.

The delay control unit 214 may convey enable signals to electronic switches 217 to 220, which may be used to bypass trigger signals otherwise conveyed to at least one of the kernels 201 to 204. The switches 217 to 220 may be implemented as an option.

It is also an option to change the configuration of the selection unit 216 during runtime. For example, the first initial trigger could be TR0, then the selection unit 216 changes to TR1 as initial trigger, then to TR2, then to TR3 and then again to TR0, etc. Of course, the order is just an example and various successions could be used accordingly.

The kernel 201 (also referred to as "ADC KERNEL0" or "MASTER" kernel) obtains the trigger signal 205 "Trigger0" from the delay unit 209 and supplies a signal TR0 to the selection unit 216. The kernel 202 (also referred to as "ADC KERNEL1" or "SLAVE0" kernel) obtains the trigger signal 206 "Trigger1" from the delay unit 209 and supplies a signal TR1 to the selection unit 216. The kernel 203 (also referred to as "ADC KERNEL2" or "SLAVE1" kernel) obtains the trigger signal 207 "Trigger2" from the delay unit 209 and supplies a signal TR2 to the selection unit 216. The kernel 204 (also referred to as "ADC KERNEL3" or "SLAVE2" kernel) obtains the trigger signal 208 "Trigger1" from the delay unit 209 and supplies a signal TR3 to the selection unit 216.

Any of the signals TR0 to TR3 can be used by the selection unit 216 to map it as an initial trigger signal conveyed to any of the kernels 201 to 204 and then select the remaining kernels based on the delays accordingly after that initial trigger signal. According to the example shown in FIG. 2, the signal TR0 is the initial trigger signal (also referred to as master signal) for the kernel 201. The trigger signal "Trigger0" from the delay circuit 210 is a trigger signal without delay, i.e. the delay unit is bypassed for the master kernel 201. Hence, the signal TR0 is used as the initial trigger signal; the first kernel to be triggered via the signal 205 based on the initial trigger signal is the kernel 201 with no delay. Next, the kernel 202 is triggered via the signal 206 after a delay set by the delay circuit 211. Then, the kernel 203 is triggered via the signal 207 after a delay set by the delay circuit 212 and finally the kernel 204 is triggered via the signal 208 set by the delay circuit 213. After that, a new burst conversion cycle can be started. Burst conversions may be chained after one another by using the last trigger as first trigger input.

It is also an option to configure the delay units in such a way that all kernels convert at the same time or substantially at the same time. Hence, the trigger signal Trigger2 does not have to come after the trigger signal Trigger1 (because of the varying amounts of delay). For example, in an embodiment all kernels may start at the same time, in another embodiment, a trigger signal may not be generated (it may be skipped) and in a further embodiment, e.g., the trigger signal Trigger2 may be issued before the trigger signal Trigger1 thus commencing conversion of the kernel 203 before the kernel 202. In addition, aspects of these embodiments could be combined in a particular use case.

Figure 3:
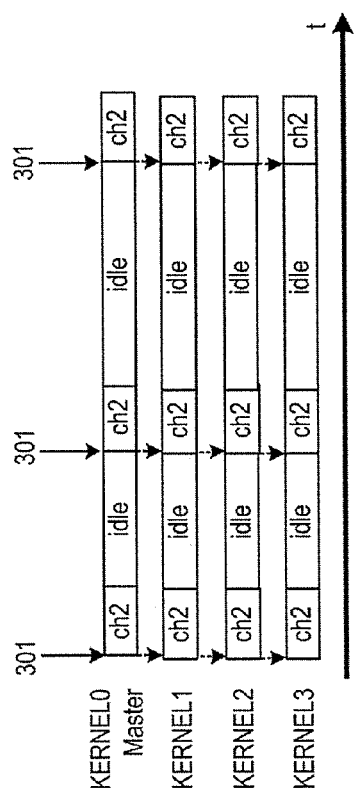
FIG. 3 shows a conversion or sampling without any delay, i.e. without the solution presented herein for comparison purposes.

FIG. 3 shows a conversion sequence without any delay, i.e. without the solution presented herein for comparison purposes. The trigger signals 301 trigger the MASTER kernel as well as the other kernels KERNEL1 to KERNEL3 in parallel. An analogue channel—for example channel 2 "ch2"—is converted into a digital signal, the conversion being processed before reaching idle time for each of the kernels.

Figure 4:
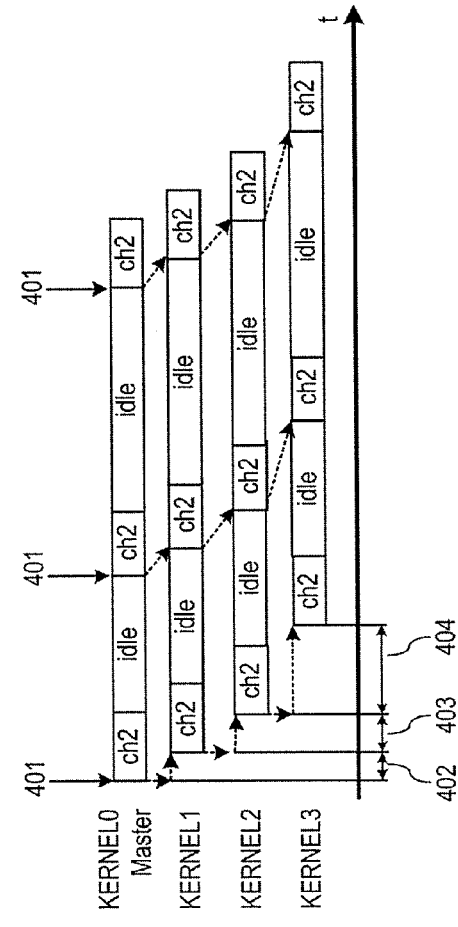
FIG. 4 shows an example conversion sequence with different delays according to the proposal set forth herein.

FIG. 4 shows an example conversion sequence with different delays according to the proposal set forth herein. KERNEL0 corresponds to the kernel 201 and KERNEL1 to KERNEL3 correspond to kernels 202 to 204 shown in FIG. 2.

The trigger 401 corresponds to the trigger signal 205 "Trigger0" supplied to the KERNEL0 201 (not introducing any delay by the delay circuit 210). KERNEL1 202 is triggered with a delay 402 introduced by the delay circuit 211, which supplies the delayed signal Trigger1 206. Accordingly, KERNEL2 203 is triggered with a delay 403 introduced by the delay circuit 212, which supplies the delayed signal Trigger2 207. Finally, KERNEL3 204 is triggered with a delay 404 introduced by the delay circuit 213, which supplies the delayed signal Trigger3 208.

Example Embodiment: Burst Measurement of a Signal

The solution presented allows utilizing channels of an ADC in a flexible manner. According to the example embodiment shown in FIG. 5, a sensor 501 is connected to two pins 508 and 509 of a microcontroller 502. The microcontroller 502 comprises an ADC 503 with four kernels 504 to 507. Pin 508 is connected to the kernels 504, 505 and pin 509 is connected to the kernels 506, 507.

Figure 5:
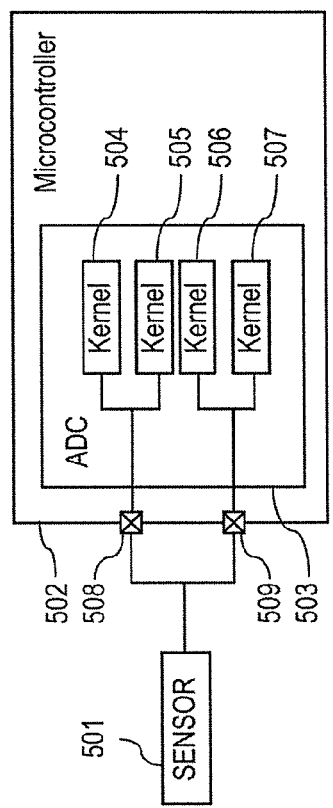
FIG. 5 shows an example block diagram with a sensor being connected to several kernels of an ADC within a microcontroller.
Figure 6:
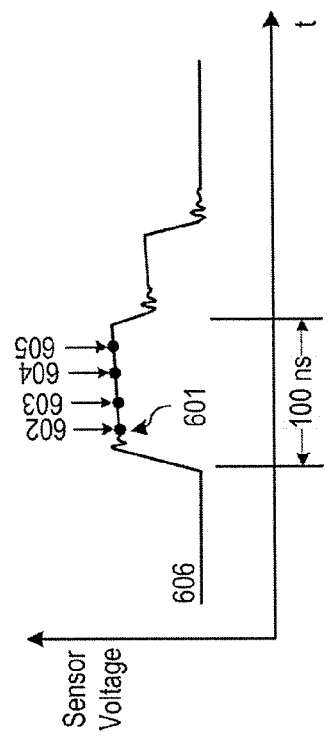
FIG. 6 shows a timing diagram visualizing a burst conversion provided by the arrangement of FIG. 5.

FIG. 6 shows a timing diagram visualizing a burst conversion provided by the arrangement of FIG. 5. The sensor 501 supplies a sensor voltage 606 to the microcontroller 502. Based on a trigger signal 601, the kernels 504 to 507 subsequently convert the analog measurements 602 to 605 into digital signals. This can be achieved after the trigger signal 601 within a time frame of, e.g., 100 ns. In the example shown in FIG. 6, the delays between the conversions can be set (substantially) uniformly distributed over time.

Such scenario can be used in power converters, e.g., in the domain of motor control algorithms.

By utilizing a burst conversion, i.e. subsequent measurements of analog signals in a very short period of time, it is possible to ensure a good reproduction of the analog signal 606 and thus an accurate control loop can be provided based on such samples of the analog signal 606.

For example, the digital representations of the analog measurements 602 to 605 can be used for generating an averaging value (in addition to other filtering means) from these measurements, in particular for additional noise rejection purposes.

In a particular use case, a trigger signal could be provided, e.g., by a timer unit. In some scenarios it may be beneficial to add some delay before sampling the signal. One reason could be a sensor that requires a few microseconds to provide signals that are suitable for sampling. Hence, a first kernel could be configured such that it does not convert the signal, but a first delay circuit could be used to produce the amount of delay required for the sensor to settle to a stable state. In addition or as an alternative, a delay circuit could be provided for the initial trigger signal as well; this delay circuit may in other cases be set to zero or be cut short (skipped), but for this example scenario it can be set to a value other than zero to give the sensor time to settle.

Example Embodiment: Measurement via Four Sensors in a Short Time Frame Window

Figure 7:
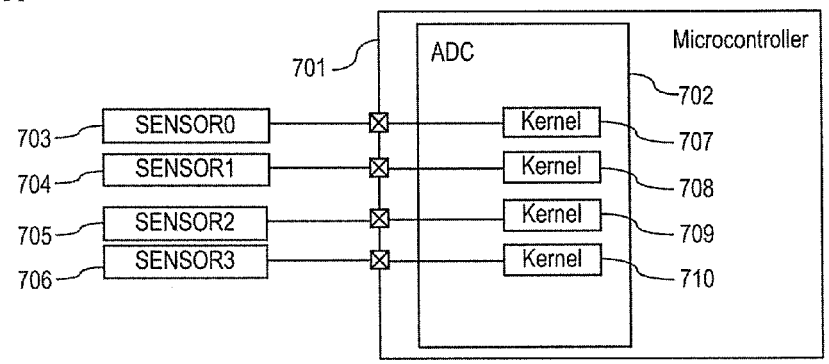
FIG. 7 shows an example block diagram with four sensors being connected to several kernels of an ADC within a microcontroller.

FIG. 7 shows an example block diagram with four sensors 703 to 706 being connected to kernels 707 to 710 of an ADC 702 within a microcontroller 701.

Figure 8:
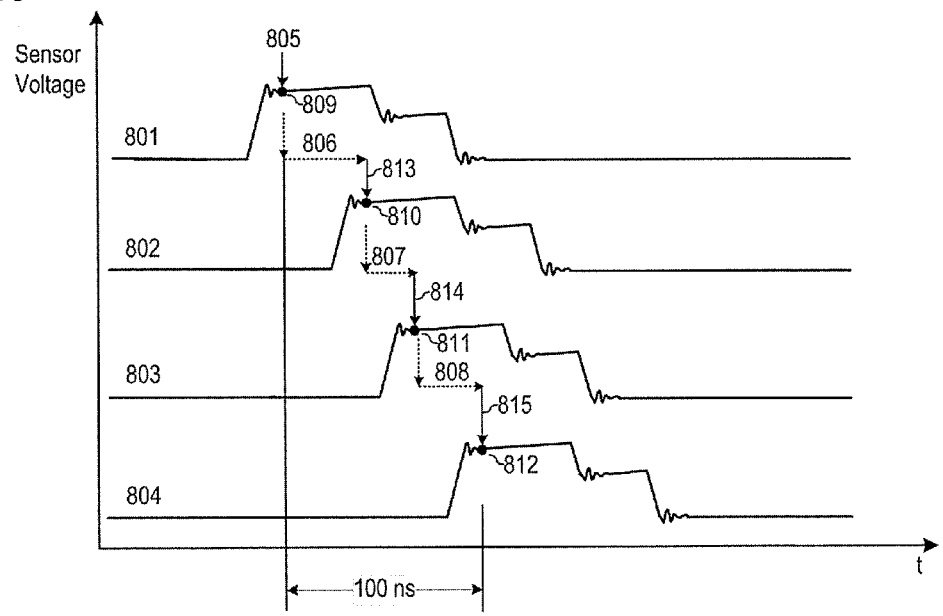
FIG. 8 shows a timing diagram visualizing a conversion of measurements provided by four sensors according to the arrangement of FIG. 7.

FIG. 8 shows a timing diagram visualizing a conversion of measurements provided by the four sensors 703 to 706 according to the arrangement of FIG. 7. The sensor 703 provides an analog voltage signal 801, the sensor 704 provides an analog voltage signal 802, the sensor 705 provides an analog voltage signal 803 and the sensor 706 provides an analog voltage signal 804.

Based on a trigger signal 805, the kernel 707 conducts a conversion of the measurement 809. After a delay 806, a trigger signal 813 causes the kernel 708 to conduct a conversion of the measurement 810. After a delay 807, a trigger signal 814 causes the kernel 709 to conduct a conversion of the measurement 811 and after a delay 808, a trigger signal 815 causes the kernel 710 to conduct a conversion of the measurement 812.

The conversions of the measurements 809 to 812 from the various sensors 703 to 706 can be conducted within a time window amounting to, e.g., 100 ns. The delay between the conversions may be constant or variable. In one embodiment, the delay may amount to 25 ns.

As an example embodiment, the kernels 707 and 709 can be based on the same kernel hardware; the same may apply for the kernels 708 and 710. Alternatively, the kernels can be implemented in separate hardware portions.

The solution can be advantageously utilized in combination with applications that require, e.g., a compensation of delay or phase shift, in particular based on measurement delay. Hence, a useful and efficient tool for calibration can be implemented based on the suggested solution.

Example Embodiment: Logarithmic or Exponential Conversion Sequence

As indicated, the amounts of delay for issuing trigger signals that cause the respective kernel(s) to conduct conversions may be set and/or adjusted in a fixed or flexible manner.

Figure 9:
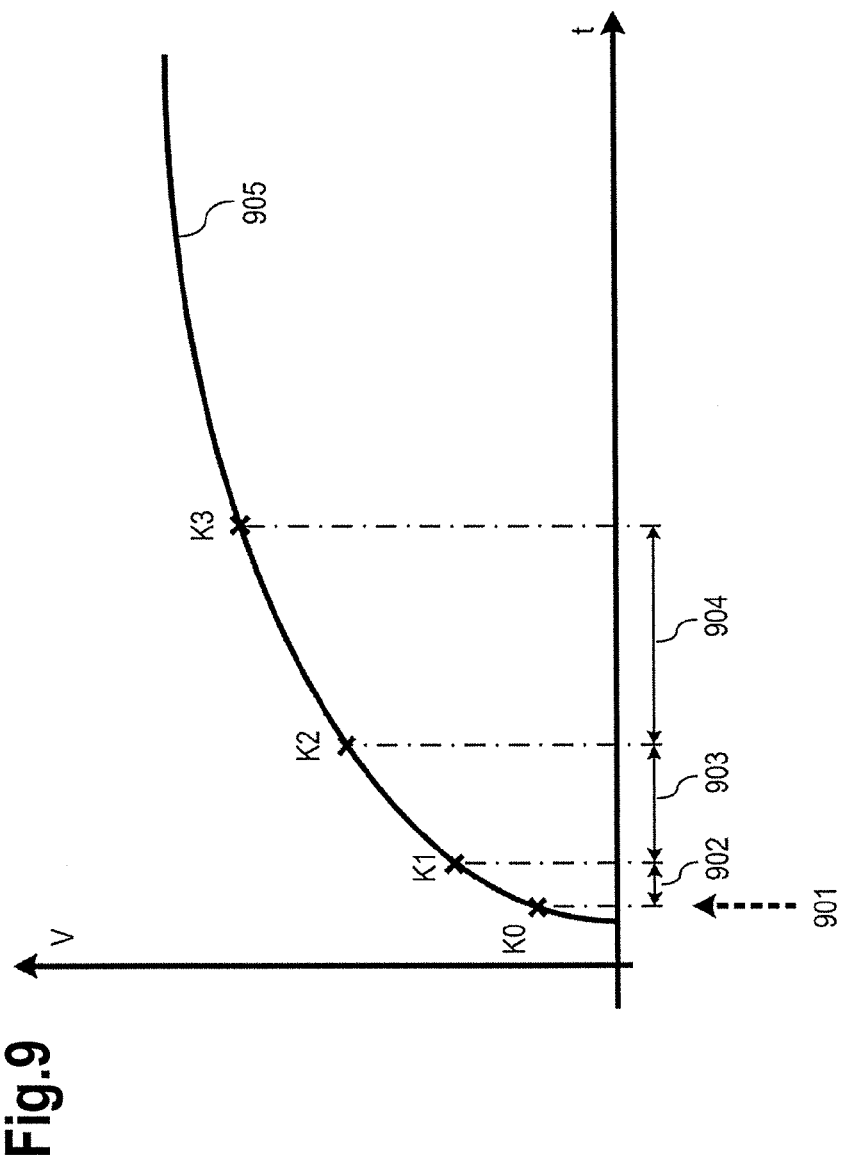
FIG. 9 shows an example graph of an analog voltage signal of logarithmic shape over time.

FIG. 9 shows an example graph of an analog voltage signal 905 of logarithmic shape over time. Based on a trigger signal 901, a first conversion of the measurement K0 is conducted. After a delay 902, a next conversion of the measurement K1 is conducted and after a subsequent delay 903 a conversion of the measurement K2 is conducted. Next, after a delay 904 a conversion of the measurement K3 is conducted. The amounts of delay increase exponentially from the delay 902 towards the delay 904 in this embodiment.

Of course, delays may be adjusted flexibly based on a particular use case scenario, e.g., linearly, logarithmically, based on a predefined values or any kind of distribution or function.

Such flexibly adjusted or adjustable delays can be used during start-up phases of machines or power converters and/or or for sensor calibration purposes. This solution is in particular useful as the advantage of such measurement distribution increases with the number of kernels available in the ADC, because more conversions can be done and a better tracking of the signal can thus be achieved. For example, the "last" trigger could be fed back to close the loop, which results in an sequencing/sampling solution with an specific shape being independent from a particular trigger signal.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. An analog-to-digital conversion system, comprising:
at least two analog-to-digital conversion units configured to receive a plurality of analog signals and convert the analog signals to digital signals; and
a delay unit comprising at least one delay circuit, wherein the analog-to-digital conversion system is configured to convey trigger signals to the analog-to-digital conversion units, wherein at least one of the trigger signals is delayed via the at least one delay circuit,
wherein the delay unit comprises a delay control unit configured to adjust an amount of delay for each of the delay circuits.

2. The analog-to-digital conversion system according to claim 1, wherein each trigger signal indicates a beginning or an impeding beginning of an analog-to-digital conversion conducted by the respective analog-to-digital conversion unit to which the trigger signal is applied.

3. The analog-to-digital conversion system according to claim 1, wherein a delay for more than two delay circuits is uniformly or substantially uniformly distributed over time.

4. The analog-to-digital conversion system according to claim 1, wherein a delay for more than two delay circuits is non-uniformly distributed over time.

5. The analog-to-digital conversion system according to claim 1, wherein the at least one delay circuit comprises a plurality of delay circuits, and wherein the delay unit comprises a selection unit configured to select one of the delay circuits as a master delay circuit.

6. The analog-to-digital conversion system according to claim 1, further comprising at least one sensor that is connected to the at least one analog-to-digital conversion unit.

7. The analog-to-digital conversion system according to claim 1, wherein the delay unit is implemented externally to the at least two analog-to-digital conversion units.

8. The analog-to-digital conversion system according to claim 1, wherein the delay unit is configured to cut short or skip a delay circuit or to set an amount of delay for the delay circuit to zero or to substantially zero.

9. An analog-to-digital converter, comprising:
at least two analog-to-digital conversion units configured to receive a plurality of analog signals and convert the analog signals to digital signals; and
a delay unit comprising at least one delay circuit;
wherein the delay unit is configured to asynchronously trigger the analog-to-digital conversion units via the at least one delay circuit, and
wherein the delay unit comprises a delay control unit configured to flexibly adjust an amount of delay for each of the delay circuits.

10. The analog-to-digital converter according to claim 9, wherein the delay unit is configured to asynchronously trigger the analog-to-digital conversion units by conveying trigger signals to the analog-to-digital conversion units, wherein at least one of the trigger signals is delayed via the at least one delay circuit.

11. The analog-to-digital converter according to claim 9, wherein each trigger signal indicates a beginning or an impending beginning or an analog-to-digital conversion conducted by the respective analog-to-digital conversion unit to which the trigger signal is applied.

12. An analog-to-digital conversion system, comprising:
several analog-to-digital conversion units configured to receive a plurality of analog signals and converting the analog signals to digital signals; and
a delay unit comprising several delay circuits;
wherein the analog-to-digital conversion system is configured to successively convey trigger signals to each of the analog-to-digital conversion units, wherein a delay between conveying the trigger signals is adjustable via the delay circuits of the delay unit, and
wherein an output of each delay circuit provides a trigger signal for the analog-to-digital conversion units except for the analog-to-digital conversion unit that provides the first conversion.

13. The analog-to-digital conversion system according to claim 12, wherein an output of each delay circuit provides a trigger signal for each respective analog-to-digital conversion unit.

14. A method for converting analog signals into digital signals, comprising:
converting a plurality of analog signals into digital signals based on the trigger signals that are successively provided to several analog-to-digital conversion units,
wherein the trigger signals are supplied by a delay unit via delay circuits, and
wherein the delay unit comprises a delay control unit configured to flexibly adjust an amount of delay for each of the delay circuits.

15. The method according to claim 14, wherein the trigger signals are provided within a duration of a clock cycle.

16. The method according to claim 14, wherein the trigger signals are provided based on a base clock or on multiple clock cycles of a base clock.

17. An analog-to-digital conversion system, comprising:
means for supplying trigger signals; and
means for converting a plurality of analog signals into digital signals based on the trigger signals that are successively provided to several analog-to-digital conversion units,
wherein the means for supplying the trigger signals comprise delay circuits, wherein each delay circuit supplies a trigger signal for one of the analog-to-digital conversion units, and
wherein at least one delay circuit comprises a delay control unit configured to flexibly adjust an amount of delay for each of the delay circuits.

* * * * *